United States Patent [19]

Sahasrabudhe et al.

[11] 4,179,629

[45] Dec. 18, 1979

[54] FAILSAFE LOGIC FUNCTION APPARATUS

[75] Inventors: Arun P. Sahasrabudhe, West Mifflin; Jayant K. Kapadia, Pleasant Hills, both of Pa.

[73] Assignee: Westinghouse Electric Corp., Pittsburgh, Pa.

[21] Appl. No.: 823,482

[22] Filed: Aug. 10, 1977

[51] Int. Cl.$^2$ .............................. H03K 3/42; 250/552
[52] U.S. Cl. ..................................... 307/311; 307/218
[58] Field of Search .................. 307/311; 250/211 J, 250/552, 553, 218

[56] References Cited

U.S. PATENT DOCUMENTS

| | | | |
|---|---|---|---|
| 3,413,480 | 11/1968 | Biard et al. | 250/552 |
| 3,486,029 | 12/1969 | Barrett et al. | 250/552 |
| 3,826,930 | 7/1974 | Perry | 307/311 |
| 3,975,643 | 8/1976 | Toth | 307/311 |
| 3,995,173 | 11/1976 | Sibley | 307/311 |

Primary Examiner—Stanley D. Miller, Jr.
Assistant Examiner—B. P. Davis
Attorney, Agent, or Firm—R. G. Brodahl

[57] ABSTRACT

An improved failsafe logic function apparatus is disclosed which includes an input signal section and an output signal section, with a middle gating network section isolated from each of the input signal section and the output signal section. An external control signal determines the logic function operation of the apparatus.

10 Claims, 12 Drawing Figures

FAILSAFE LOGIC FUNCTION APPARATUS

CROSS REFERENCE TO RELATED APPLICATION

The present application is related to a previously filed patent application Ser. No. 651,304, filed Jan. 22, 1976 by A. P. Sahasrabudhe and T. C. Matty, and which is assigned to the same assignee as the present application.

BACKGROUND OF THE INVENTION

It is known in the priot art to provide a failsafe optically coupled logic function apparatus, as shown by U.S. Pat. No. 3,826,930 of R. H. Perry, which can perform the AND, the OR, the latching and the signal transfer function. For the failsafe control of mass transit vehicles, this optically coupled failsafe logic function apparatus performs the same logic functions that were previously performed by vital relays. A light emitting diode device is energized to emit light in response to the concurrent provision of a first logic control signal in conjunction with the presence of a second input signal.

It is known in the prior art to provide a failsafe logic apparatus having an input module including a light emitting diode and an output module including a light responsive active circuit means, as shown by U.S. Pat. No. 3,995,173 of H. C. Sibley.

DESCRIPTION OF THE PREFERRED EMBODIMENT

Figure 1:
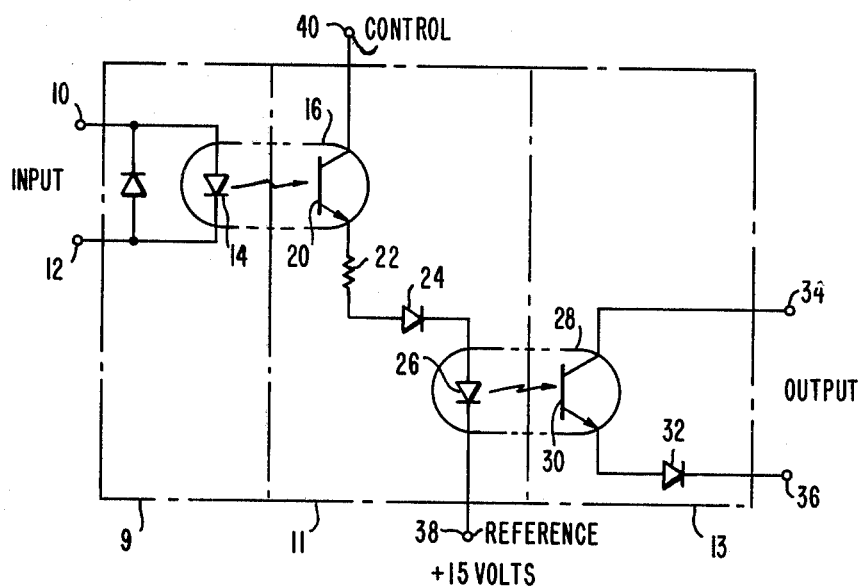
FIG. 1 shows the improved logic function apparatus of the present invention, operative in a most positive control signal arrangement.

In FIG. 1 there is shown the logic function apparatus of the present invention operative in a most positive control signal arrangement. An input signal section 9 includes the input signal terminals 10 and 12, a reverse voltage protection diode 18 and a light emitting diode 14 of a first optical isolator device 16. The light emitting diode 14 has a predetermined breakdown voltage characteristic such that light is emitted by the diode 14 when an alternating current signal passes through the diode 14 in a forward direction having a voltage equal to or greater than the known breakdown voltage is applied across the diode 14. A middle gating network section 11 includes a light energy detector transistor switch 20 having in its emitter circuit a resistor 22, a reverse voltage protection diode 24 and the light emitting diode 26 of a second optical isolator device 28. The output signal section 13 includes the light detector transistor switch 30 of the second optical isolator device 28, a reverse voltage protection diode 32 and the output signal terminals 34 and 36.

The middle section 11 is isolated from both the input signal section and the output signal section. The light emitting diode 14 will emit no light for optical transmission to the detector transistor 20 if current flows through the diode 14 in a reverse direction, so the input diode 14 is referenced to negative system voltage as compared to the middle section which has a most positive system voltage reference applied to terminal 38. The voltage of the enable control signal applied to the terminal 40 is more positive than the most positive system voltage applied to terminal 38.

The logic function apparatus shown in FIG. 1 can perform a failsafe AND logic function in accordance with the relationship.

$$A \cdot B = C \tag{1}$$

The input signal A can be applied to the input terminals 10 and 12. The input signal B can be applied to the control signal terminal 40, and the output signal C will be provided by the output terminals 34 and 36. For example, the system positive reference voltage of +15 volts can be applied to reference terminal 38. A more positive input signal B voltage of greater than +15 volts can be applied to the control terminal 40. The voltage of the input signal A applied to the terminals 10 and 12 has to be of sufficient magnitude to overcome the threshold of the diode 14. The input signal A can be a direct current signal or can have a frequency ranging from this DC signal up to hundred of kilohertz. The output signal C will be provided by the output terminals 34 and 36 when the control voltage B causes the transistor 20 to conduct in conjunction with light energy from the light-emitting diode 14 provided in response to the input signal A.

Figure 2:
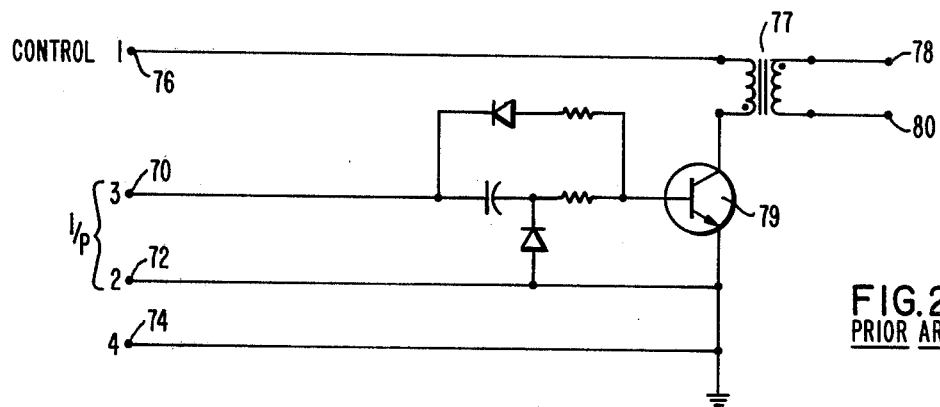
FIG. 2 shows a prior art logic function apparatus, operative in a most positive control signal arrangement.

The prior art logic function apparatus shown in FIG. 2 will operate as a failsafe AND logic gate in accordance with the above relationship $A \cdot B = C$ of equation 1, when an AC input signal A is applied to input terminals 70 and 72, a positive system reference voltage of +15 volts is applied to reference terminal 74 and the signal B is applied to control terminal 76, which signal B has the voltage more positive than the most positive system voltage of +15 volts applied to reference terminal 74. A signal coupling transformer 77 is provided in series with the transistor switch device 79 and connected between the control signal terminal 76 and the reference voltage terminal 74. The output signal C is provided by the output terminals 78 and 80.

Figure 3:
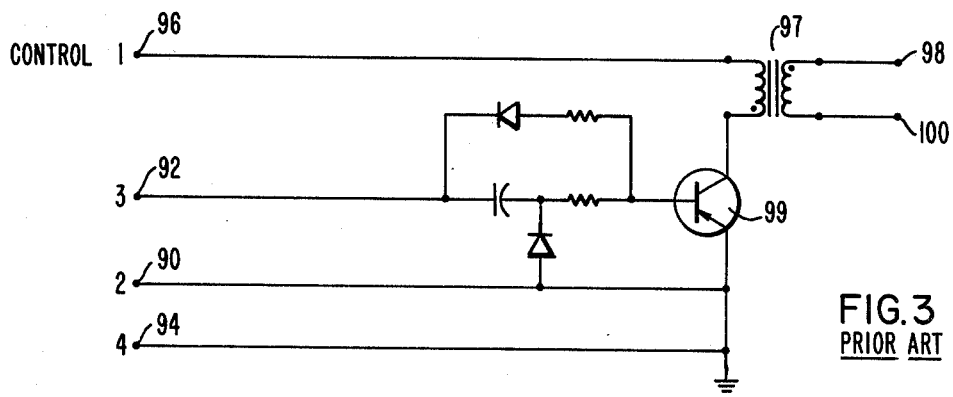
FIG. 3 shows another prior art logic function apparatus, operative in a most negative control signal arrangement.

In FIG. 3 there is shown a prior art logic function apparatus operative as a failsafe AND gate in accordance with the relationship $A \cdot B = C$ of above equation (1). When the AC input signal A is applied to input terminals 90 and 92 and a most negative system voltage of −15 volts is applied to the reference terminal 94, a more than most negative voltage control signal B applied to the control enable input 96 will provide the signal C at output terminals 98 and 100. The signal coupling transformer 97 is provided in series with the transistor switch device 99 and connected between the control signal terminal 96 and the reference signal terminal 94.

Figure 4:
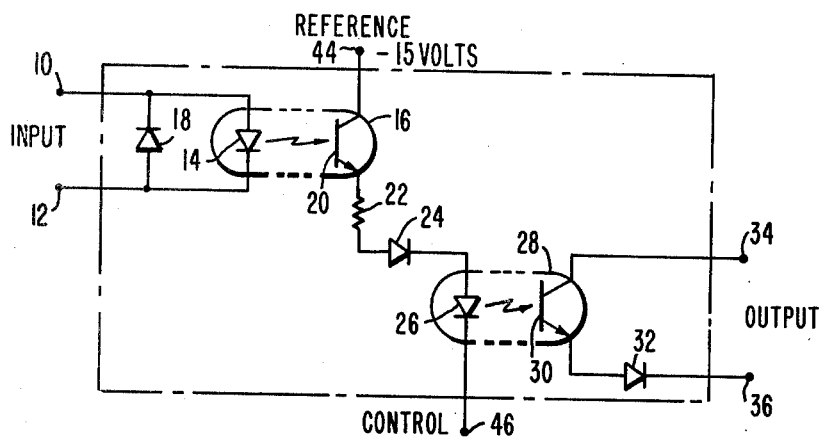
FIG. 4 shows the logic function apparatus of the present invention, operative in a most negative control voltage arrangement.

In FIG. 4 there is shown the logic function apparatus of the present invention arranged with the most negative system voltage of −15 volts applied to reference terminal 44. When a control signal B, which is still more negative than the −15 volts system reference, is applied to control terminal 46 and the AC input signal A is applied to terminals 10 and 12, then the output signal C is provided by the terminals 34 and 36.

Figure 5:
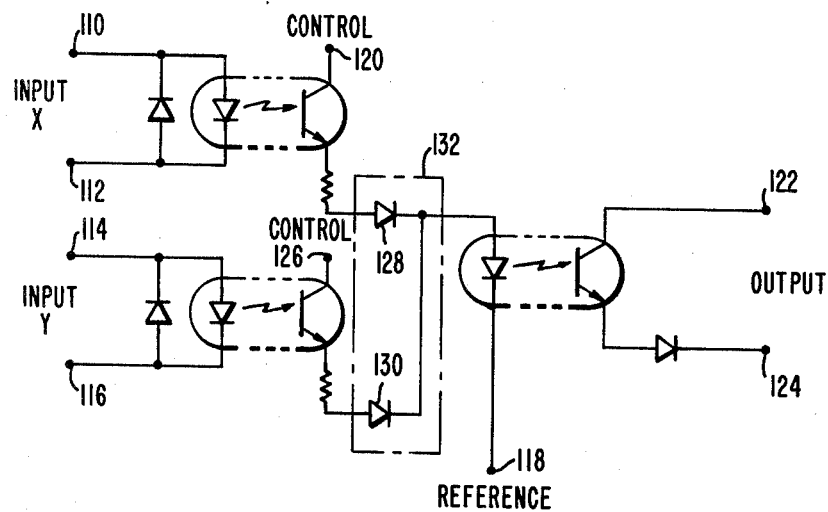
FIG. 5 shows the logic function apparatus of the present invention, operative to select a desired one of several input coded signals.

In FIG. 5 there is shown one application of the logic function apparatus of the present invention to select a desired one of several input coded signals. Input signal X having a first frequency F1 is applied to input terminals 110 and 112 and input signal Y having a second frequency F2 is applied to input terminals 114 and 116. A system positive reference voltage such as +15 volts is applied to reference terminal 118. If a first control signal having a voltage more positive than the system reference voltage at terminal 118 is applied to the control terminal 120 then the input signal X will appear at the output terminals 122 and 124. On the other hand if a second control signal having a voltage more positive than the system reference voltage at terminal 118 is applied to the control terminal 126, then the input signal Y will appear at the output terminals 122 and 124. The diodes 128 and 130 function as an OR logic circuit 132.

Figure 6:
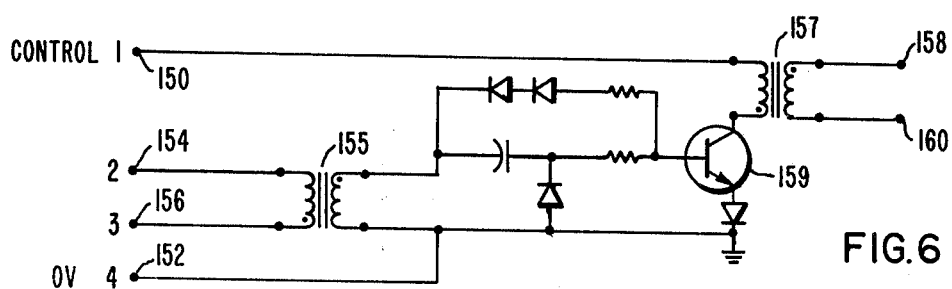
FIG. 6 shows a prior art signal transfer gate, operative, with a most positive control signal.

In FIG. 6 there is shown a prior art signal transfer gate operative with the most positive control signal applied to terminal 150 in relation to a system positive reference voltage of +15 volts applied to the reference terminal 152. The input signal applied to terminals 154 and 156 is transferred to the output terminals 158 and 160 when a more positive control signal is applied to the control terminal 150. The signal coupling transformer 157 is provided in series with the transistor switch 159 and connected between the control enable signal terminal 150 and the system reference voltage terminal 152. The signal coupling transformers 157 and 155 are substantially more expensive than the optical isolator devices 16 and 28 shown in FIG. 1 and are physically larger in size.

Figure 7:
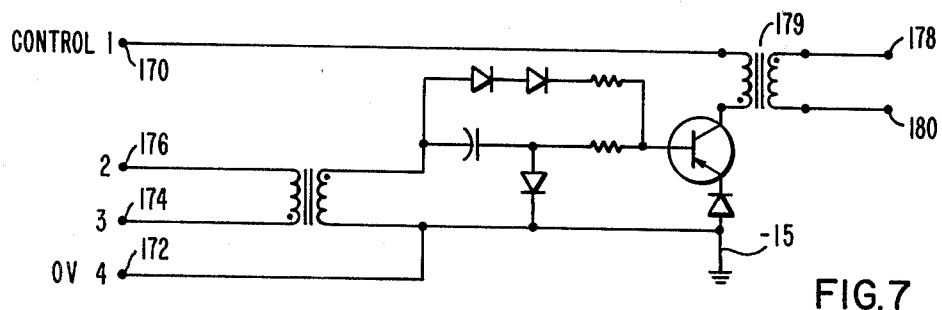
FIG. 7 shows a prior art signal transfer gate, operative, with a most negative control signal.

In FIG. 7 there is shown a prior art signal transfer gate where a control enable signal applied to terminal 170, that is more negative than the negative system reference voltage of −15 volts applied to reference terminal 172, results in the input signal applied to input terminals 174 and 176 being transferred to the output terminals 178 and 180 through the signal coupling transformer 179.

Figure 8:
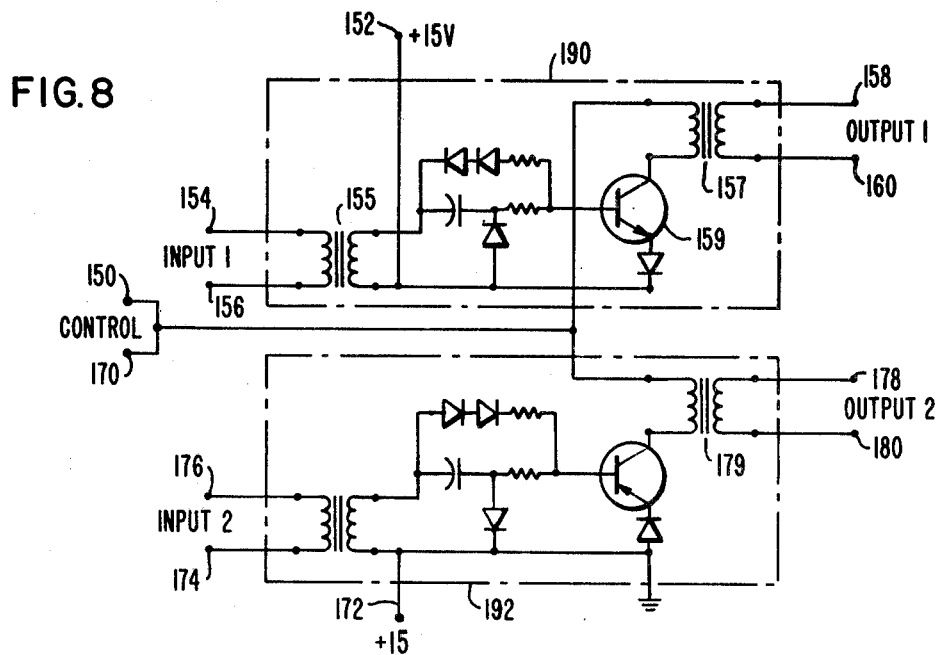
FIG. 8 shows a prior art transfer gate, operative with a plurality of input signals.

In FIG. 8 there is shown a prior art transfer gate application with a plurality of input signals. The transfer gate 190 is in accordance with the disclosure of FIG. 6 and the transfer gate 192 is in accordance with the disclosure of FIG. 7. If a control enable signal is applied to terminal 150 which is more positive or greater than the system reference voltage of +15 volts applied to each of reference terminals 152 and 172, then the input signal applied to terminals 154 and 156 will transfer to output terminals 158 and 160. If a control enable signal is applied to terminal 170, which is less positive or less than the system reference voltage of +15 volts applied to each of reference terminals 152 and 172, then the input signal applied to terminals 174 and 176 will transfer to output terminals 178 and 180.

Figure 9:
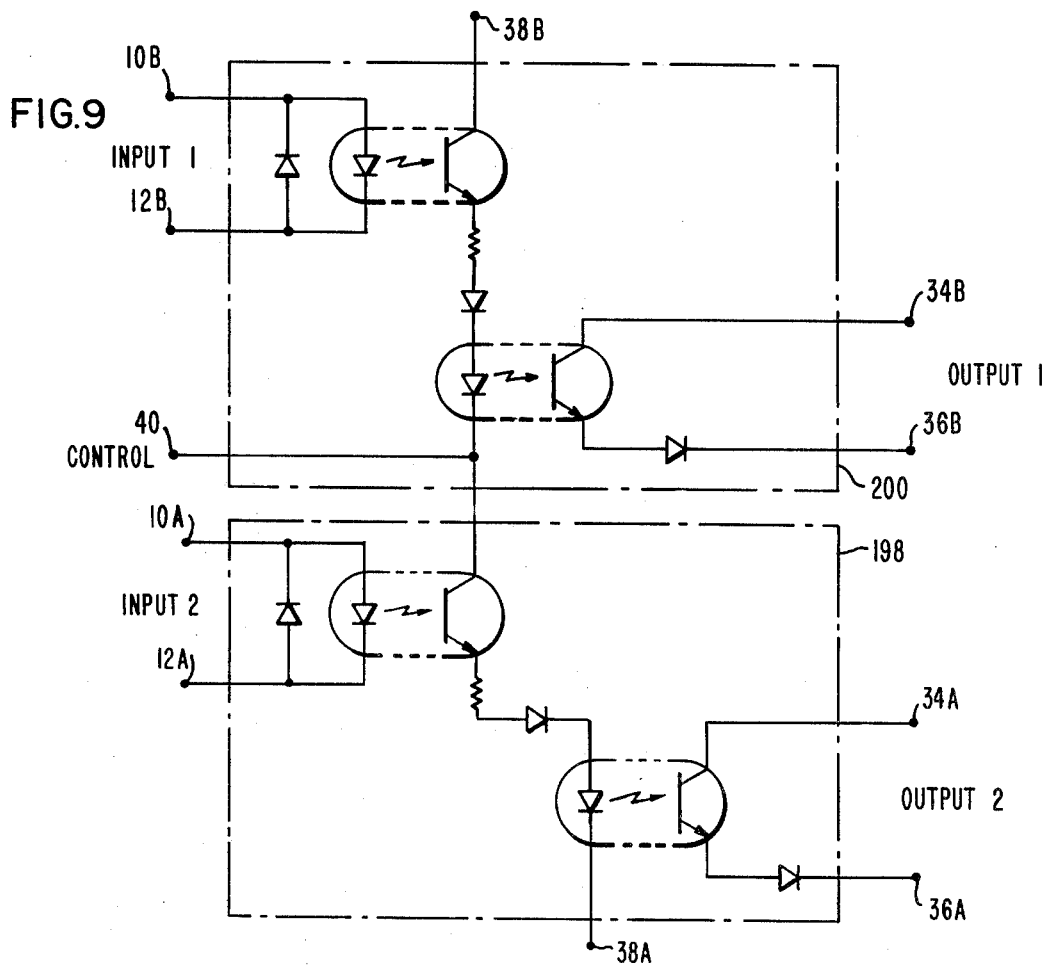
FIG. 9 shows a transfer gate, operative with a plurality of input signals in accordance with the present invention.

In FIG. 9 there is shown a transfer gate apparatus operative with a plurality of input signals in accordance with the present invention. The transfer gate 198 and the transfer gate 200 are in accordance with the disclosure of FIG. 1. If a control enable signal is applied to control terminal 40 which is more positive than the system reference voltage of +15 volts applied to reference terminal 38A, then the input signal at terminals 10A and 12A will transfer to the output terminals 34A and 36A. If a control enable signal is applied to control terminal 40 which is less positive than the system reference voltage of +15 volts applied to reference terminal 38B, then the input signal at terminals 10B' and 12B' will transfer to output terminals 34B' and 36B'.

Figure 10:
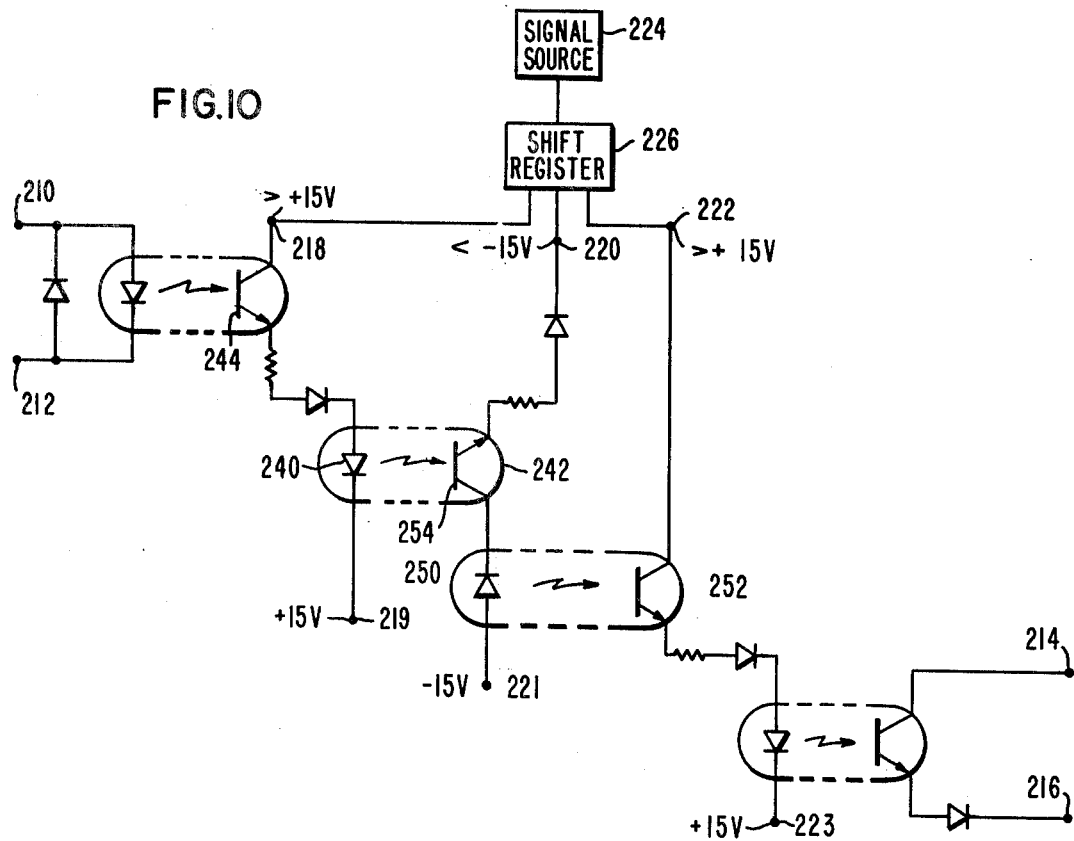
FIG. 10 shows an input signal decoding tree apparatus in accordance with the present invention.

In FIG. 10 there is shown an input signal decoding tree apparatus in accordance with the present invention. The input signal applied to terminals 210 and 212 will pass to the output terminals 214 and 216 only if all respective middle sections are satisfied with signals having the proper polarity. More specifically, as shown in FIG. 10, the input signal applied to terminals 210 and 212 will appear at the output terminals 214 and 216 only if a predetermined code of controlled signals is applied to the respective control terminals 218, 220 and 222. A signal source 224, which could be the antenna and speed code signal receiver carried by a train vehicle and response to speed coded vehicle control signals from the signal block occupied by the train vehicle, supplies serial bits of an input signal to be decoded such as a three bit speed code signal 101 corresponding to a vehicle speed of 50 mph to a shift register 226. As the input signal bits successively shift through the register 226, the respective bits of the provided output signal from the register 226 are applied to the control terminals 218, 220 and 222. For the above example speed control signal, as the least significant bit 1 having a voltage greater than the +15 volts reference voltage on terminal 219 is first applied to control terminal 218, the input signal on terminals 210 and 212 will not appear at output terminals 214 and 216. When a shift occurs in register 226 the least significant bit 1 will move to control terminal 220 and the second bit 0 having a voltage less than the −15 volts reference voltage on terminal 221 will be applied to control terminal 218 and the input signal at terminals 210 and 212 will not appear at terminals 214 and 216. When another shift occurs in register 226, the first bit 1 will go to control terminal 222, the second bit 0 will go to control terminal 220 and the third bit 1 will go to control terminal 218, and the input signal at terminals 210 and 212 will now be enabled to appear at the output terminals 214 and 216.

Figure 11:
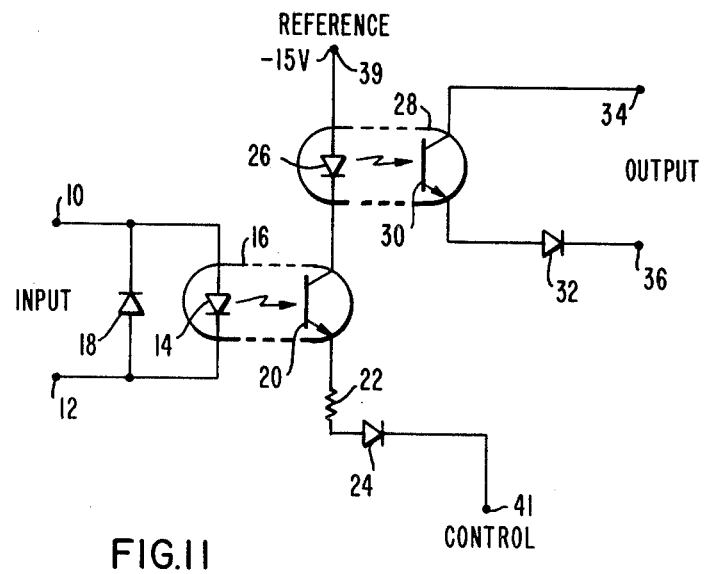
FIG. 11 shows the logic function apparatus of FIG. 1 connected with the emitter of the light sensitive switch device being responsive to the control signal voltage.

In FIG. 11 there is shown a modification of the logic function apparatus of FIG. 1, with the emitter of the light sensitive switch device 20 being responsive to the control enable signal applied to terminal 41 and the system reference voltage of −15 volts being applied to reference terminal 39. The control signal applied to terminal 41 should be less than the system reference voltage of −15 volts to enable the input signal applied to terminals 10 and 12 to be provided at output terminals 34 and 36. The light-emitting diode 14 will not emit light energy if the current flowing through the diode 14 is in the wrong direction.

Figure 12:
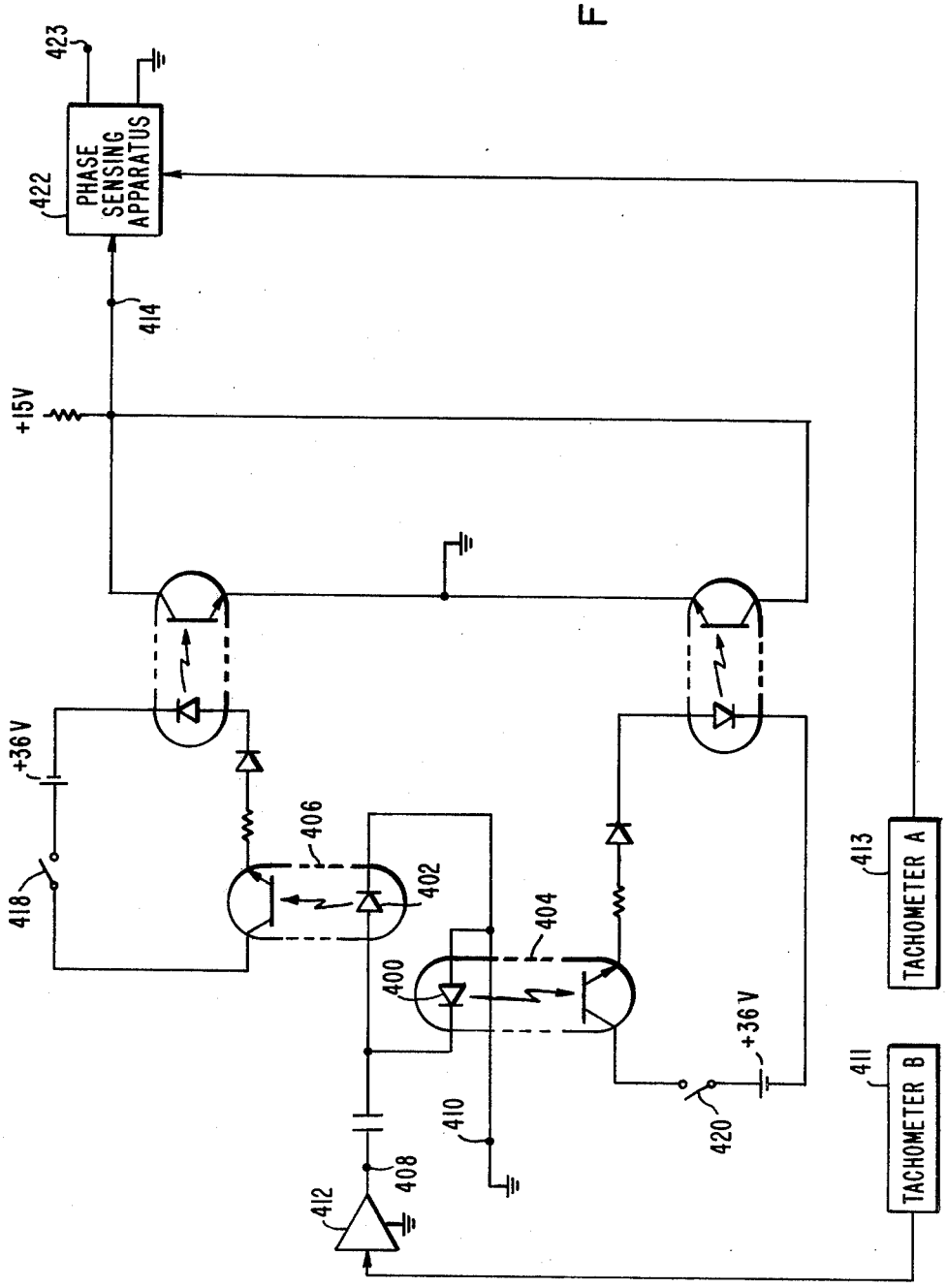
FIG. 12 shows a failsafe signal inverter apparatus, in accordance with the teachings of the present invention.

In FIG. 12 there is shown a failsafe signal inverter apparatus utilizing the teachings of the present invention. It is desired that a train vehicle moving along a track operate at a safe speed profile to avoid collisions with other train vehicles and to provide required passenger comfort. An automatic control system on board the train vehicle compares a provided reference speed signal with a tachometer actual speed signal for controlling the vehicle speed. In addition, a movement direction determination is made to avoid collisions and to assure that the vehicle is moving in the desired direction. Two input signals A and B having a 90 degree phase relationship are provided from two tachometers mounted on the same axle as disclosed in U.S. Pat. No. 3,783,339 of T. C. Matty. One input signal leads the other depending upon the direction of vehicle movement. If the vehicle should be backwards it is important that this movement be detected. For a desired backward movement, it can be required to invert one of the input signals to provide a signal relationship which indicates a proper vehicle movement. The circuit apparatus shown in FIG. 12 is provided for this purpose. The light emitting diode 18 shown in FIG. 1 can be replaced with the light emitting diodes 400 and 402, for the respective optical isolators 404 and 406. The input signal currents through the diodes 400 and 402 will be out of phase as shown by the directional arrangement of the diodes 400 and 402, which diodes emit light only when the input signal current passes through the diode in the forward direction of the diode. One of the two input signals, for exaple input signal B from tachometer 411, is applied to the input terminals 408 and 410 from an operational amplifier 412, and the output signal from the signal inverter apparatus is provided at terminal 414. A switch 418 is closed by the vehicle operator when he selects the desired forward movement direction or by the automatic train operation control system. A switch 420 is closed by the operator when he selects a desired backward movement direction. In the operating condition where the vehicle is desired to move forward and the input signal A from tachometer 413 leads the input signal B from tachometer 411, the switch 418 is closed and the output signal B at terminal 414 is not inverted so the signal A leads the signal B as sensed by the phase sensing apparatus 422. In the operating condition where the vehicle is desired to move backward and the input signal B now leads the input signal A, the switch 420 is closed and the output signal B at terminal 414 has been inverted so the phase sensing apparatus 422 still senses a signal A leading the inverted signal B. The phase sensing apparatus 422 provides an output signal at terminal 423 to stop the vehicle if the output signal B at terminal 414 leads the signal A from tachometer 413. Should any undesired backward movement of the vehicle occur when the forward switch 418 is closed, the signal B at terminal 414 would lead the signal A from tachometer 413 and a control signal at terminal 423 would be provided to stop the vehicle. In a similar manner, if the vehicle moves forward when the backward switch 420 is closed, a vehicle stopping signal would be provided at terminal 423.

As shown in FIG. 1, the diode 18 has a directional signal characteristic in that the input signal current has to flow in a forward direction through the diode 18 for light emission to occur. In the same manner, the diode 26, will emit light only when the signal current flow through the diode 26 is in a forward direction. The middle section 11 is electrically isolated from the input signal section 9 and the output signal section 13. The voltage bias provided by the control voltage applied to terminal 40 in relation to the reference voltage applied to terminal 38 need not be related to the power supply for the input section 9 and the power supply for the output section 13, such that in effect a double isolation is provided in relation to leakage current paths between the input signal applied to the input section 9 and the output signal from the output section 13. The light emitting diode 240 of the second optical isolator device 242 is shown in the emitter circuit of the transistor 244 in FIG. 10, whereas the light emitting diode 250 of the optical isolator device 252 is shown in the collector circuit of the transistor 254. The circuit arrangement of FIG. 10 permits staggering of alternate bias voltages for improving the failure mode caused by leakage current from an input signal light emitting diode to its associated light detector transistor and from an output signal light emitting diode to its light detector transistor, by preventing the occurrence of leakage current paths and for stopping the normal function of the logic apparatus. The electrically isolated and floating middle section, requiring an energy transformation from electrical to optical and back to electrical at each of the input isolator device 16 shown in FIG. 1 and the output isolator device 28, permits providing a different bias voltage across the middle section 11 as compared to the input section 9 and the output section 13. As shown in FIGS. 5 and 10, a plurality of middle floating sections can be included if desired. FIG. 10 in addition, shows staggered reverse bias voltages across the middle floating sections to failsafe leakage current paths and additionally improve the failure characteristics of the apparatus. The staggered bias voltage prevents leakage currents and in addition stops the normal logic function of the apparatus so as failure is thereby detected.

What we claim is:

1. In logic function apparatus having a predetermined voltage reference and providing an output signal in accordance with a first input signal and a second input signal applied to said apparatus, the combination of
   first means having a voltage bias and including a first diode and emitting light energy in response to said first input signal,
   second means including a second diode biased by the voltage reference and emitting light energy in response to said second input signal having a voltage greater than said voltage reference,
   with said second means being responsive to the light energy emitted by said first means,
   third means having a voltage bias and being coupled with the light energy emitted by said second means for providing said output signal, and
   with said second means being provided with a voltage bias by the voltage reference that is different than the voltage bias across the first means and the third means.

2. The logic function apparatus of claim 1,
   with said first means including a first optical isolator device and with said second means including a second optical isolator device.

3. The logic function apparatus of claim 1,
   with said first means being electrically isolated from said second means, and
   with said second means being electrically isolated from said third means.

4. The logic function apparatus of claim 1,
with the second means including a plurality of optical isolator devices.

5. The logic function apparatus of claim 1,
with the first diode of said first means having a directional signal characteristic responsive to the current flow of the first input signal, and
with the second diode of said second means having directional signal characteristic responsive to the current flow of the second input signal.

6. The logic function apparatus of claim 1, including
voltage bias means connected to said second means for providing said system voltage reference that is different than the bias voltage across each of said first means and said third means.

7. In logic function apparatus having a voltage reference and providing an output signal in accordance with a first input signal concurrently applied to said apparatus with a second input signal, the combination of
first optical isolator means including a first diode for emitting first light energy in response to the first input signal having a voltage greater than the known breakdown voltage of the first diode,
second optical isolator means including a second diode biased by the voltage reference and responsive to the first light energy for emitting second light energy in response to the second input signal having a voltage greater than the voltage reference, and
means responsive to the light energy emitted by the second optical isolator means for providing said output signal.

8. The logic function apparatus of claim 7,
with the first optical isolator means including a first light detector responsive to the first light energy from the first diode, and
with the second optical isolator means including a second light detector responsive to the second light energy from the second diode.

9. The logic function apparatus of claim 7,
with the first optical isolator means including a light detector responsive to the first light energy from the first diode, and
with the second optical isolator means being coupled with said light detector.

10. The logic function apparatus of claim 7,
with the first diode of the first optical isolator means being responsive to the current flow direction of the first input signal, and
with the second diode of the second optical isolator means being responsive to the current flow direction of the second input signal.

* * * * *